United States Patent [19]
Melmoth

[11] 3,989,358
[45] Nov. 2, 1976

[54] ADJUSTABLE MICROMETER STAGE

[75] Inventor: David L. Melmoth, Ann Arbor, Mich.

[73] Assignee: KMS Fusion, Inc., Ann Arbor, Mich.

[22] Filed: Nov. 21, 1974

[21] Appl. No.: 525,748

[52] U.S. Cl. .................................. 350/247; 33/298; 350/252
[51] Int. Cl.² ........................................ G02B 7/02
[58] Field of Search ........... 350/247, 252, 115, 116; 356/124, 172; 33/246, 248, 298

[56] References Cited
UNITED STATES PATENTS

| | | | |
|---|---|---|---|
| 2,452,592 | 11/1948 | Meyer | 33/298 |
| 3,359,849 | 12/1967 | Friedman | 350/247 |

FOREIGN PATENTS OR APPLICATIONS

| | | | |
|---|---|---|---|
| 1,229,565 | 3/1960 | France | 350/252 |
| 307,187 | 3/1932 | Germany | 350/247 |
| 284,518 | 4/1931 | Italy | 350/247 |

Primary Examiner—Eugene La Roche
Attorney, Agent, or Firm—Barnes, Kisselle, Raisch & Choate

[57] ABSTRACT

An improved mount for an optical lens or similar device for achieving X-Y adjustment which includes four diametrically opposed 90° spaced knife edges on a lens ring opposed on one side by a spring and on the other side by a micrometer adjustment to provide positive control in the X and Y directions, each motion being independent of the other.

1 Claim, 2 Drawing Figures

ADJUSTABLE MICROMETER STAGE

This invention relates to an Adjustable Micrometer Stage and more particularly to a mounting system for large diameter lens cells in an optical system.

It is an object of the present invention to provide an improved mount for a lens ring which has a four-point suspension which allows a motion in one direction without disturbing the position 90° to that direction. With three-point suspension units, this cannot be accomplished. In addition, backlash is minimized by a spring-loading system and the parts for accomplishing the invention are minimal in number and relatively simple. Unlike standard X-Y stacks of micrometer adjusted stages, the position of the micrometers in this device is fixed, thus simplifying the attachment of remote control linkages or motor drives.

Other objects and features of the invention will be apparent in the following description and claims in which the principles of the invention are set forth together with the best mode presently contemplated for the accomplishment thereof.

Figure 1:
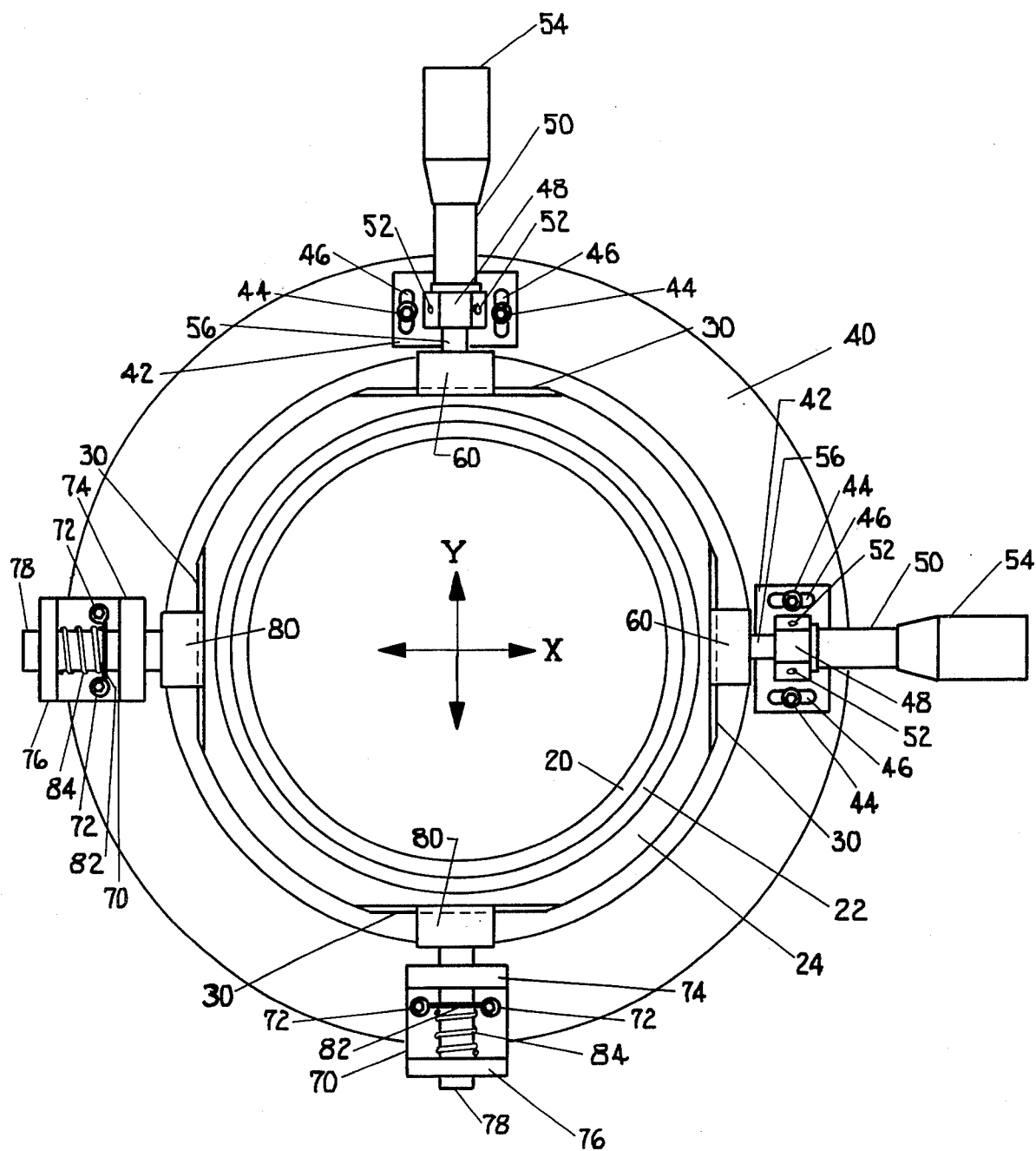

DRAWINGS accompany the disclosure and the various views thereof may be briefly described as:

FIG. 1, a plan view showing the assembly of parts.

Figure 2:
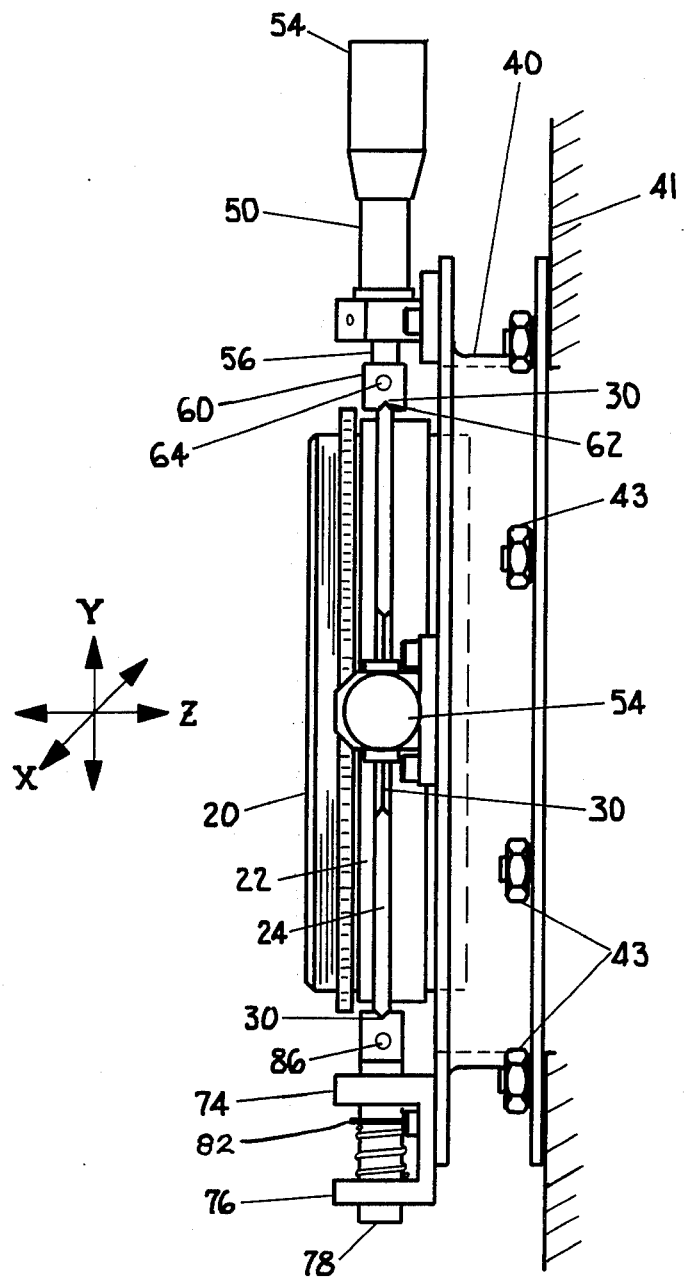

FIG. 2, a side view of the assembly shown in FIG. 1.

REFERRING TO THE DRAWINGS:

A threaded lens cell 20 is carried in a threaded mounting ring 22, this mounting ring having an annular thin flange 24 extending around the periphery thereof. This flange 24 has four straight tangential surfaces 30 arranged in diametrically opposed pairs at 90° to each other, these straight portions 30 having a V-shaped configuration to form what is called a knife edge. A double flange ring 40 is suitably mounted on a frame 41 by bolts 43. This flanged ring 40 carries four brackets spaced 90° apart. Two of these brackets 42 are adjustably mounted by socket head screws 44 passing through slots 46. Each of these brackets carries a riser portion 48 in each of which is securely mounted the body 50 of a micrometer head with non-rotating spindle.

Set screws 52 are used to secure this mounting. The micrometer head 50 has a rotating finger piece 54 which controls the axial position of the head. To the non-rotating spindle 56 of micrometer head 50, a polyimide bearing block 60 is fastened. This may be referred to as a pressure block or pressure means. The blocks are preferably formed of a dense plastic. This block 60 has on its outer face a groove 62 (FIG. 2). These blocks are secured to the shaft by set screws 64. It will be seen that the V-shaped groove 62 complements the knife edge 30 on the ring flange 24.

Diametrically opposed to the two brackets 42 and the above-described assemblies carried thereby are U-shaped brackets 70 held on the flange of ring 40 by screws 72. These brackets have two opposed upstanding end portions 74-76 which are drilled to provide a bearing through which shaft 78 slides. Shaft 78 carries on its inner end a polyimide block 80 (pressure block or pressure means) which is provided with a groove to complement the knife edges 30. A C-ring 82 on each of the shafts 78 serves as a spring rest for a coil spring 84 which spring loads the shaft 78 and the block 80 toward the knife edges 30. The block 80 is secured to the shaft 78 by set screws 86.

Thus, it will be seen that the pressure blocks 60 which are controlled in their radial position by the micrometer heads 50 are resisted diametrically by the spring 84 acting on the shaft 78 and the pressure blocks 80. The V-groove and knife edge interengagement may be described as a tongue and groove relationship.

Accordingly, the X-Y positions of a lens in the ring 20 can be easily controlled by operating one or both of the micrometer finger pieces. A retraction of top micrometer head 50 in the Y direction will cause the lens to move up as viewed in FIG. 1 by reason of the spring 84 acting on the bottom block 80. Similarly, a horizontal motion of the right-hand micrometer head as viewed in FIG. 1 in the X direction can be achieved by moving the micrometer head 50 through finger piece 54. A Z axis motion perpendicular to the plane of X-Y motion is accomplished by rotating lens cell 20 in mounting ring 22.

I claim:

1. A mounting structure for an optical element and the like for achieving X-Y adjustment on a Z axis which comprises:
    a. a support ring having four tangential slide surfaces spaced 90° from each other around the circumference to form orthogonal pairs,
    b. four slide blocks engaging, respectively, a slide surface on side ring, over a tangential lineal span, in a tongue and groove sliding relationship on the tangent of said surface,
    c. a support frame surrounding said support ring,
    d. four brackets on said frame spaced 90° from each other around said frame to register with said surfaces on said ring,
    e. a radially disposed shaft on each said bracket to support each said slide blocks, respectively,
    f. means on two of said adjacent brackets resiliently biasing said shafts and two of said slide blocks radially inwardly against respective slide surfaces, and
    g. manually operable means radially advanceable and retractable on said remaining brackets to control the radial position of said remaining two shafts and slide blocks.

* * * * *